May 3, 1966 N. HOLONYAK, JR 3,249,473

USE OF METALLIC HALIDE AS A CARRIER GAS IN THE VAPOR DEPOSITION OF III-V COMPOUNDS

Filed May 21, 1965

INVENTOR:
NICK HOLONYAK, JR.

BY Urban H. Faubion

HIS ATTORNEY.

United States Patent Office 3,249,473
Patented May 3, 1966

3,249,473

USE OF METALLIC HALIDE AS A CARRIER GAS IN THE VAPOR DEPOSITION OF III–V COMPOUNDS

Nick Holonyak, Jr., Urbana, Ill., assignor to General Electric Company, a corporation of New York Filed May 21, 1965, Ser. No. 457,754
14 Claims. (Cl. 148—175)

This application is a continuation of my co-pending application, Serial No. 134,903, now abandoned, filed August 30, 1961 and assigned to the assignee of the present invention.

The present invention relates to preparation and epitaxial growth of intermetallic compounds and mixtures thereof and particularly relates to the deposition and epitaxial growth of Group III–V semiconductor compounds.

In the present state of the semiconductor device art, germanium and silicon are the commonly used semiconductor materials for making such semiconductor devices as diodes, rectifiers, transistors, photocells and the like. In the production of such devices, various processes and techniques are utilized, among them are the epitaxial deposition of these elemental semiconductor materials on a suitable monocrystalline substrate from a vapor compound of the elemental semiconductor. Such processes are advantageously employed in making certain kinds of devices as well as devices not capable of being made without such a process.

Some Group III–V semiconductor compounds are currently being used for certain semiconductor devices such as tunnel diodes and they are being proposed for other devices such as transistors. At present, no process is available to epitaxially deposit compound semiconductors. Such a process, particularly if simple, would facilitate the fabrication of known types of devices using these materials as well as permit the fabrication of novel devices not heretofore available. It is evident that without such a process the full potential of compound semiconductor materials cannot be realized. The present invention is directed to fulfilling the need for such processes.

Accordingly, an object of the present invention is to provide a simple and effective process for preparation of compound semiconductors.

Another object is to provide a simple and effective process for epitaxially depositing compound semiconductors on a variety of substrates.

Still another object is to provide processes for fabricating novel devices as well as permitting optimizing the design of known devices.

Group III–V compound semiconductor materials have energy band gaps extending from values considerably less than the value for germanium to values considerably more than for silicon. It is possible to fabricate bodies composed of a mixture of compounds to produce a semiconductor with the desired band gap as well as other desired characteristics. The present invention is also directed to providing a simple and effective process for making bodies composed of a mixture of semiconductor compounds, as well as to provide novel devices from such mixed semiconductor compounds.

The features of the invention which are believed to be novel are set forth with particularity in the appended claims. The invention itself, however, both as to its organization and method of operation together with further objects and advantages thereof, may best be understood by reference to the following description taken in accordance with the accompanying drawings in which:

Heretofore, some of the electrical semiconductor materials such as germanium have been deposited on monocrystalline substrates. In one such process, such as disclosed in United States Patent 2,692,839—Christensen and Teal, germanium is epitaxially grown on a germanium substrate. Iodine is provided in that process to react with a source of germanium to form an iodide which is transported to the substrate where it is reduced (or can be disproportionated) to epitaxially deposit germanium on the substrate. I have discovered that intermetallic compounds such as gallium arsenide, gallium phosphide and indium phosphide are very readily transported and deposited, either heterogeneously upon the walls of the reaction vessel or epitaxially upon seed crystals or substrates by halogens and halogen compounds. I have obtained such results in a simple closed-tube process in which a free halogen or a halogen supplied by a metal halide is used to transport and grow epitaxial layers of intermetallic compounds and mixed intermetallic compounds.

Figure 1:
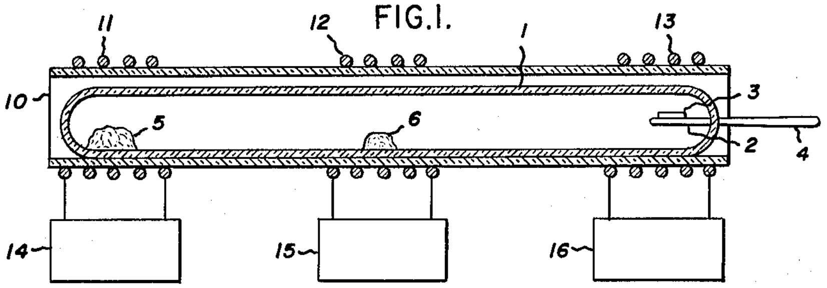
FIGURE 1 is a cross-sectional view of apparatus for carrying out the present invention.

The apparatus utilized for accomplishing the results specified above is shown in FIGURE 1. This figure shows a closed quartz tube 1 conveniently one centimeter in diameter and from six to fifteen inches long. At one end of the tube is located a platform 2 on which a substrate or seed crystal 3 is placed. While not absolutely necessary, there is provided at the same end a radiation pipe 4 (quartz rod) which functions to lower the temperature of the substrate platform relative to the adjacent surrounding walls thereby assuring crystal growth to occur on the substrate rather than the surrounding walls. A preselected quantity which is not critical of a source 5, for example, the intermetallic compound, such as gallium arsenide, gallium phosphide and indium phosphide mentioned above, or the metallic ingredient thereof, is located near the other end of the tube. A quantity of excess arsenic or phosphorus usually 5 to 20 milligrams and usually 5 to 50 milligrams of either $ZnCl_2$, $CdCl_2$, $CuCl_2$, $SnCl_2$, $MgCl_2$, $HgCl_2$, or $AlCl_3$, are also located in a zone 6 of the tube between source and seed. The tube is placed in a suitable furnace consisting of a hollow support tube 10, the temperature profile of which may be adjusted. As shown, the temperature of the furnace and hence of the source and the seed may be controlled by resistive heating elements 11, 12 and 13. These elements are connected to adjustable sources of current 14, 15 and 16, respectively.

In the actual carrying out of the process of the invention, the tube and its contents are very carefully heated and outgassed to insure removal of water before evacuation and sealing. For example, if a gallium arsenide wafer is used as the seed, it is first etched in a suitable solution such as two parts white etch by volume (one part hydrofluoric and three parts nitric acid, by volume), two parts nitric acid and one part acetic acid, rinsed with pure water and then dried in air. The tube is cleaned in white etch, rinsed, and then dried, after which the materials to be used are placed in appropriate locations or zones in the tube. The tube is secured to a vacuum system, pumped, and heated for a sufficient time to drive out the moisture. Thereafter, it is allowed to cool and vacuum is drawn until the desired vacuum is reached, usually $10^{-3}$ to $10^{-5}$ millimeters Hg, at which time the tube is sealed and is ready for placement in the furnace.

If the halogen for transport purposes is not introduced by means of a metal halide, the quartz tube is back-filled with about ¼ atmosphere of chlorine, or alternatively about 10 milligrams of iodine is sealed into the tube. The end of the tube containing the relatively non-volatile materials or the source crystals, for example, such compounds as gallium arsenide, gallium phosphide and indium phosphide mentioned above, is heated from 900° C. to 1100° C. and the cooler end from 600° C. to 900° C. for compounds such as gallium arsenide, gallium phosphide and indium phosphide. When seed crystals are used for the deposition of epitaxial layers, lower temperatures are frequently employed than when deposition is allowed to proceed on the walls of the reaction vessel, and a given run may be as short as an hour. When deposition is sought on the vessel walls, a run may be allowed to proceed for as long as two weeks to produce more massive crystals. Of course, after completion of the run, the products of the process are removed by opening the tube.

If the source material is doped properly or if a doping impurity is included in the closed tube individually or as part of the halogen compound, epitaxial layers of conductivity type opposite to that of the seed crystal can be grown to form a junction layer, or a layer of arbitrary conductivity type and resistivity. Of course, the doping material used, whether introduced as an individual element or as part of the halogen compound, is a material which either in itself is volatile at the temperatures used in the process and hence transportable to the seed crystal of the closed tube, or is volatile as part of a halogen compound and is decomposable or capable of disproportination on the seed crystal.

While compounds such as GaAs, GaP, and InP are very readily transported and deposited either heterogeneously upon the walls of the reaction vessel or epitaxially upon seed crystals, GaSb is transported slowly and with great difficulty. These results suggest that only those compounds with at least one relatively volatile negative valent constituent are best suited for transport and epitaxial growth in the closed cycle system. It is believed that as the source crystal is heated, some of the more volatile constituent of the Group III–V compound (As or P) is driven off until the source is in equilibrium with its more volatile component, the halogen sealed in the system attacks and transports the less volatile constituent, Ga for example, and by disproportionation reactions at an appropriate lower temperature, the less volatile constituent is released and combines with some of the relatively volatile constituent of the compound and reforms the compound. The coolest part of the reaction tube is held at a temperature such that the more volatile constituent of the intermetallic compound is at one or more atmospheres pressure. This apparently insures that the transported elements will combine and deposit as the compound and aids in suppressing thermal decomposition of the newly-grown compound.

Now specific examples and typical results obtained in the preparation and epitaxial deposition of semiconductor compounds in accordance with the present invention, particularly GaAs, GaP and $GaAs_xP_{1-x}$, will be described. Also, various junction structures and heterojunctions which have been fabricated will be described.

Following the methods outlined above, large polycrystals of GaAs have been grown directly on one end of quartz reaction tubes. Iodine, $ZnCl_2$, $HgCl_2$, $CdCl_2$, $SnCl_2$, $AlCl_3$, and $MgCl_2$ have been used to transport the GaAs. When one of the metal chlorides is employed, of course, the doping impurity may be introduced along with the halogen necessary for transport purposes. Of course, such doping material should be either volatile or otherwise transportable to the lower temperature end of the reaction tube. $ZnCl_2$ and $CdCl_2$ have been used to transport GaAs and dope it degenerately P-type. Both of these compounds are decomposable at the temperatures used for carrying out the process mentioned above into their elemental constituents, each of which is volatile, the chlorine being used to react with the heavier positive valent element gallium, volatilizing it in the form of a compound, transporting it to the cooler end of the reaction tube and enabling a disproportionization reaction to deposit the gallium and form gallium arsenide and, of course, the zinc and cadmium being volatile of their own accord can either move in the direction of the cooler end of the tube or be transported in the form of a compound and impregnate or dope the gallium arsenide P-type. Tunnel diodes have been alloyed on the materials so prepared and have yielded peak-to-valley current ratios as high as 30:1. Tunnel junctions have been grown directly by transporting and growing, with 10 to 20 mg. of $ZnCl_2$, P-type GaAs on an N-type seed doped to about $10^{19}$ atoms/cm.$^3$. The source crystal was held at about 900° C. and the seed crystal at about 600° C. in a 12-hour run. Crystals transported and doped with $HgCl_2$ or $MgCl_2$ were P-type but not degenerate. Crystals transported and doped with $SnCl_2$ were N-type with carrier concentrations of $3.5\times10^{18}$/cm.$^3$ and were easily made degenerate P-type when free zinc was sealed in the reaction vessel with the $SnCl_2$.

By the methods described above, both N-type and P-type GaAs have been grown epitaxially upon, respectively, P-type and N-type seeds. X-ray determinations indicate that the deposited material has the orientation of the seed crystal, and such structures exhibit the usual junction properties, i.e., blocking in the reverse direction, conduction in the forward direction, etc.

Another type of structure which has been fabricated in GaAs by vapor transport and epitaxial growth is an $N^+\pi P^+$ diode. Crystals of gallium arsenide doped $N^+$ with about $10^{19}$ atoms/cm.$^3$ were used as seeds. The center $\pi$-type regions were grown roughly one mil (one-thousandth of an inch) thick by utilizing $CuCl_2$ as the transport and doping agent. A copper-doped GaAs layer grown by using about 20 mg. $CuCl_2$ in the closed-tube process appears to be sufficiently compensated to give the desired high resistivity (semi-insulating), i.e., near intrinsic or compensated. The layer of $P^+$ GaAs was grown on the $\pi$ or semi-insulating regions in 12-hour runs employing about 20 mg. $ZnCl_2$.

The $N^+\pi P^+$ diodes which have been fabricated have the expected capability of blocking current in the reverse direction, while in the forward direction they conduct by means of space-charge-limited emission into the $\pi$ region. Depending upon the particular experimental run, in response to applied voltages forward currents have been observed over a range of four decades, which increase as $V^n$, where $n$ ranges from 2.5 to 3.6. These diodes have the very interesting property of being more photosensitive in the forward than in the reverse direction. A group of these devices of different values of $n$ connected in parallel would cause current to flow in response to an applied voltage which is a function of the currents in the individual branches, thereby making it possible to electrically synthesize polynomial functions.

Figure 2:
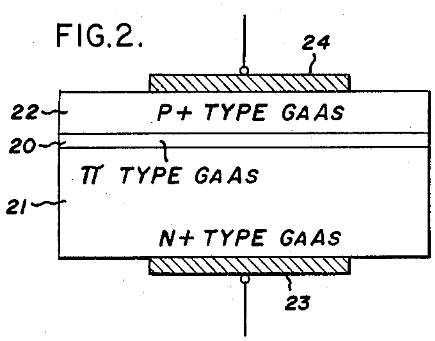
FIGURE 2 is a cross-sectional view of a two-electrode device made in accordance with the present invention.

FIGURE 2 shows such a diode as described in the preceding paragraphs in which a $\pi$-type gallium arsenide layer 20 has been grown on $N^+$ gallium arsenide seed 21. In turn, a $P^+$ gallium arsenide layer 22 has been grown on the $\pi$-type layer. A suitable conduction electrode 23 of fernico, for example, is ohmically secured to the $N^+$ layer by a suitable solder such as lead-tin solder having about 1% sulfur, and another suitable conductive electrode 24 of fernico, for example, is ohmically secured to the $P^+$ layer by a lead-tin solder having about 1% zinc.

Still another type of structure which has been successfully fabricated is the deposition and epitaxial growth of GaAs on germanium substrates. Such structures are useful because they make possible wide bandgap emitters of high injection efficiency in germanium transistors. To fabricate such a structure, $ZnCl_2$ was used as the transport and doping agent. The seed germanium crystals were held at 550° C. to 600° C. and the source GaAs at 900° C. in 12-hour runs. Electrically, GaAs-Ge heterojunctions displayed forward characteristics intermediate between those of germanium and gallium arsenide P-N junctions.

Figure 3:
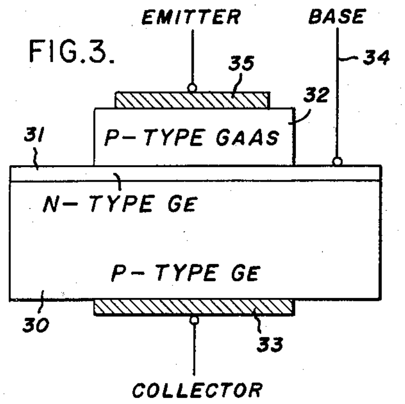
FIGURE 3 is a cross-sectional view of a transistor with a wide band gap emitter made in accordance with the present invention.

FIGURE 3 shows a transistor with a wide bandgap emitter having a germanium collector 30 and base 31 and a gallium arsenide emitter 32. To fabricate the device, a germanium substrate which has the collector and base prepared by techniques well-known in the art is used. In the figure the germanium substrate is shown as a P-type collector into which has been diffused an N-type base. Selected areas of the base from which deposition of the gallium arsenide is to be excluded is masked by silicon dioxide coatings thereon applied by techniques well-known in the art, for example, by the pyrolytic decomposition of ethyl orthosilicate. The gallium arsenide emitter is applied by techniques of the present invention. During the deposition and epitaxial growth of the gallium arsenide emitter, the germanium substrate crystal is held at 550° C. to 600° C. to prevent gallium or arsenic diffusion into the substrate. Conductive electrodes 33, 34, and 35 are connected to collector, base and emitter, respectively, by techniques well known in the art.

Using procedures essentially identical to those used for GaAs, GaP was readily transported and grown epitaxially on GaP and on GaAs substrates.

GaP polycrystals were also grown onto one end of a quartz reaction tube. The tube was then opened and recharged and the growth was continued with a change in conductivity type. The polycrystalline seed (initial growth) was grown in a 3-day run with a GaP source, and 5 mg. $SnCl_2$, 5 mg. P, and 2 mg. Te as the carrier of the gallium and dopants. The source end of the tube was held at 1120° C. and cool deposition end of the tube at 920° C. After the tube was recharged with more GaP, 5 mg. $ZnCl_2$, and 5 mg. P, the run was repeated with the same temperature conditions for one day. A longitudinal section through the polycrystalline growth showed clearly that individual crystallites had continued their growth, with a change in conductivity type, from the first to the second run.

With a slight modification of the usual transport procedure, GaP can be readily synthesized from its constituent elements and under certain circumstances can be deposited epitaxially upon a seed crystal. For this purpose the source materials for epitaxial deposition are gallium and red phosphorus. The gallium is sealed at one end of the tube, to be held at 1000° C. to 1100° C., and an excess of phosphorus at the opposite end, to be held between 450° C. and 500° C. or high enough to insure at least one atmosphere of phosphorus pressure. One of the metal halides, for example 20 to 50 mg. of $CuCl_2$, is also sealed into the closed tube along with a seed crystal which is located in the region from 700° C. to 800° C. With this procedure, but without the seed crystal, as much as 4 gm. of Ga has been combined with 2 gm. of P to form GaP which was deposited on the vessel walls between 700° C. and 800° C. Since this system, when used to grow epitaxial layers, has given the same results as the system employing a GaP crystal source, it seems likely that the transport and epitaxial growth of compounds proceed essentially in the manner outlined above.

The various metal halides found satisfactory for transport and epitaxial growth of GaAs are also satisfactory for GaP. GaP transported and doped with $CuCl_2$ behaves like semi-insulating GaAs, again because Cu-doping results in compensation.

Even though the GaP lattice does not match that of GaAs, it is possible to seed and grow GaP on GaAs epitaxially. An X-ray analysis of a sample crushed from such a specimen indicated the presence of $GaAs_{0.24}P_{0.76}$. This may mean that a graded transition occurs between the GaAs seed and the GaP epitaxial layer. Such a layer, like a graded glass seal, might help to accommodate lattice mismatch. GaP has been grown on a GaAs seed with a $\overline{(111)}$ or arsenic surface. The GaP was transported in a 3-hour run, with source at 1050° C., and seed at 750° C., and with 20 mg. $SnCl_2$ and 2 mg. P in the closed tube. X-ray analysis of the growth indicated single crystalline growth with the same orientation as the substrate. Under transmitted illumination, cross sections of the growth taken normal to the wafer surface reveal reddish-orange GaP grown on opaque GaAs.

Figure 4:
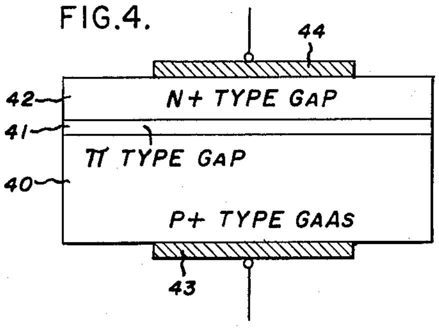
FIGURE 4 is a cross-sectional view of another two-electrode device made in accordance with the present invention.

FIGURE 4 shows a cross section of a hybrid $P^+\pi N^+$ (or $P^+ iN^+$) structure consisting of a $P^+$ GaAs seed 40, 0.0003″ of GaP $\pi$ or i region 41, and a thick $N^+$ GaP region 42. The $\pi$ or i region was grown from a GaP source with 20 mg. $CuCl_2$ and 5 mg. P in an hour. The $N^+$ region was similarly grown from a GaP source with 22 mg. $SnCl_2$ and 5 mg. of P in three hours. During the growth of each layer, the source end of the tube was held at 1050° C. and the seed end at 750° C. As in the previous example, the epitaxial $\pi$ and $N^+$ regions were grown on the $\overline{(111)}$ or arsenic face of the GaAs seed. X-ray analysis of each epitaxial layer indicated single crystalline growth with the orientation of the seed. Under transmitted illumination the middle region ($\pi$ or I) appeared red, as would be expected. Conductive electrodes 43 and 44 are connected to the $N^+$ and $P^+$ regions 40 and 42, respectively, by means of suitable solders. Electrically the structure conducted in the forward direction and blocked in the reverse. An unetched square die with edges over 1 mm. in length, mounted as a diode, switched from 10 ma. in the forward direction to essentially no reverse current in 2 nanoseconds. The capacitance of the diode was 24 pf. (picofarads).

Figure 5:
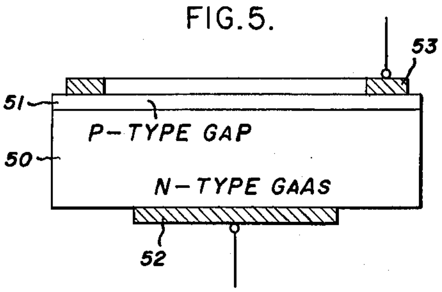
FIGURE 5 is a cross-sectional view of still another two-electrode device made in accordance with the present invention.

FIGURE 5 shows a solar cell making use of P-type GaP epitaxially deposited layer 51 on $N^+$ type gallium arsenide layer 50. Electrode 52 is ohmically connected to the N-type layer by suitable solder such as lead-tin solder with about 1% sulfur and the light receiving end of the device has a ring electrode 53 suitably secured thereto by a lead-tin solder with about 1% zinc. As gallium phosphide has a wide band and transmits most of the visible light, the layer can be made thick without impairing light transmission and at the same time permit low resistance connection to the active parts of the cell.

Following the basic procedure outlined above, GaAs and GaP can be readily synthesized into $GaAs_xP_{1-x}$. Instead of using only GaAs or GaP, preselected quantities of both are introduced simultaneously as source material for transport and co-deposition as the mixed compound. Generally the source end of the tube is heated to 1000° C. to 1100° C. while the cool or deposition end of the tube is held at 850° C. to 950° C. Under these conditions, with no seed, massive polycrystalline $GaAs_xP_{1-x}$ will grow with crystallite diameters from 2 to 3 mm.

In a number of runs performed, the ratio of arsenic to phosphorus in the source crystals (and in the $GaAs_xP_{1-x}$) was either about 10:1 or about 1:1. Relatively pure polycrystals have been grown using chlorine gas (backfill) as the transport agent. In one specific run 677 mg. of GaAs and 576 mg. of GaP yielded a mixed polycrystal (2 to 3 mm. crystallite dimensions) which transmitted red light. Preliminary measurements indicated a band gap of about 2 ev. (electron volts). Other similar crystals have been grown with band gaps from 1.8 to 1.9 ev. The measured band gaps in general have been close to those predicted on the basis of the known amounts of starting material.

Figure 6:
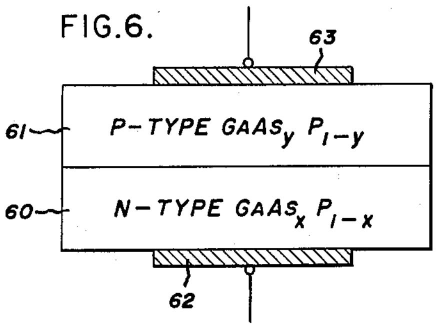
FIGURE 6 is a cross-sectional view of a light-to-electrical current conversion device made in accordance with the present invention.

FIGURE 6 shows a layer 60 of $GaAs_xP_{1-x}$ of one conductivity type and band gap grown on a layer 61 of $GaAs_YP_{1-Y}$ of the opposite conductivity type and of different band gap to form a heretojunction device. In the materials for this device, $x \neq Y$ and $x, y \leq 1$. The usual Pb-Sn solder with about 1% sulfur is used to secure a conductive electrode 62 to the N-type region and Pb-Sn solder with about 1% zinc is used to secure a conductive electrode 63 to the P-type region. Such a device has high speed, high temperature capabilities and could provide an optimized band gap for a solar cell. Obviously, homojunction devices could also be made having the same band gap, i.e. with $x=Y$. Such a diode device has, of course, the same high speed and high temperature capabilities.

Most of the $GaAs_xP_{1-x}$ crystals which have been synthesized have been deliberately doped degenerately P-type. This is readily accomplished by using $ZnCl_2$ as the transport and doping agent. Tunneling and negative resistances have been observed regularly in junctions formed by alloying tellurium-doped dots on this material. Tunnel junctions have been fabricated upon a crystal grown from 519 mg. of GaAs and 378 mg. of GaP. Ten mg. of $ZnCl_2$ was used to effect the transport and synthesis of the crystal and to obtain P-type doping. Tunnel diodes alloyed upon this crystal, and upon other similar crystals, have yielded peak-to-valley current ratios as high as 8:1 and voltage swings from tunnel region to thermal region as high as 0.8.

InP has been transported and grown with $SnCl_2$ and GaSb using iodine. In the case of GaSb, the transport is exceedingly slow as mentioned above, apparently because antimony has a substantially lower vapor pressure than either arsenic or phosphorus.

While the invention has been illustrated in a closed tube process, it will be appreciated that the invention can be carried out in an open tube process as well.

While specific embodiments of the invention have been described and shown, it will, of course, be understood that various modifications may be devised by those skilled in the art which will embody the principles of the invention and found in the true spirit and scope thereof. For example, while the invention has been illustrated in connection with Group III–V compounds and in particular the gallium compounds thereof, it will be understood that the invention applies to other compounds as well.

What I claim as new and desire to secure by Letters Patent of the United States is:

1. The process for deposition of a Group III–Group V semiconductor compound of one conductivity type, the Group V element of which is volatile, on a monocrystalline substrate of a Group III–Group V compound of the opposite conductivity type thereby to form a junction, the method comprising placing a mass of Group III–Group V semiconductor material in one end of an oblong hermetically sealed evacuated enclosure, placing said substrate at the other end of said enclosure, introducing into said enclosure a quantity of metallic halide to provide both a source of transport medium and one type conductivity inducing material, the metallic constituent of which is a metal other than one of the elements of the semiconductor compounds, heating said one end of said enclosure to a temperature and heating said other end to another temperature whereby at least a portion of said quantity of semiconductor compound and said metallic halide and conductivity type inducing material is volatilized thereby to cause epitaxial growth of said volatilized compound impregnated with said opposite conductivity inducing material on said substrate, said temperatures being maintained for a sufficient time to produce the desired deposition of said one compound on said substrate.

2. The method of preparing a semiconductor compound composed of elements of Group III and Group V of the Periodic Table of Elements comprising heating the elements thereof in a gaseous atmosphere of a metallic halide wherein said metallic constituent of said halide comprises a metal other than one of the elements of said semiconductor compound thereby to cause volatilization of said elements and thereafter cooling said elements to form said semiconductor compound.

3. The method of preparing gallium phosphite comprising placing a quantity of gallium in one end of a hermetically sealed evacuated enclosure, placing a quantity of phosphorus in the other end of said tube, placing a quantity of a metallic halide in a zone of said tube intermediate the ends thereof, said metallic element of said metallic halide selected from the group including zinc, cadmium, copper, tin, magnesium, mercury, and aluminum, heating said one end to a temperature from about 1000° C. to 1100° C., to vaporize at least a portion of said gallium, heating said other end to a temperature from about 450° C. to 500° C. to vaporize at least a portion of said phosphorous and providing a temperature in said intermediate zone of about 700° C. to 800° C. whereby said metallic halide provides a transport medium and gallium phosphide is formed from the constituents in a zone intermediate said ends.

4. The method of preparing a composite body consisting of one body of semiconductor compound material composed of an element of Group III and an element of Group V of the Periodic Table of Elements on another body, the method comprising heating the elemental constituents of said one body in a gaseous atmosphere consisting of a metallic halide source to cause volatilization of said constituents, said metallic element of said metallic halide source selected from the group including zinc, cadmium, copper, tin, magnesium, mercury, and aluminum, transporting said volatilized material to said other body, and maintaining said other body at a temperature to cause crystallization and epitaxial deposition of said volatilized material thereon to form said composite body.

5. The method of preparing a composite body consisting of one body of semiconductor compound material composed of element of Group III and Group V of the Periodic Table of Elements on another semiconductor body, the method comprising heating the elemental constituents of said one body in a gaseous atmosphere consisting of a metallic halide source to cause volatilization of said constituents, said metallic halide source selected from the group including zinc chloride, cadmium chloride, copper chloride, tin chloride, magnesium chloride, mercury chloride, and aluminum chloride, transporting said volatilized material to said other body, said other body being a semiconductor having a monocrystalline structure, and maintaining said other body at a temperature to cause epitaxia growth of said volatilized material thereon to form said composite body.

6. The method of preparing a composite semiconductor material at least a part of which comprises a semiconductor intermetallic compound from a first body of semiconductor intermetallic compound material composed of a mixture of intermetallic compounds of Group III and Group V elements of the Periodic Table of Elements and a second body of material which method comprises the steps of placing a quantity of said first body in a first zone of an evacuated hermetically sealed enclosure, placing said second body in a second zone of said enclosure, placing a quantity of a metallic halide in a third zone of said enclosure, the metallic constituent of said metallic halide being a metal other than one of the elements of said first body of semiconductor compound, maintaining said first zone and third zone at temperatures to cause volatilization of said quantity of said one body and decomposition of said metallic halide and maintaining said second zone at a lower temperature than either of said other temperatures to cause crystallization of said volatilization products to form said composite body.

7. The process of claim 6 in which said first body of semiconductor intermetallic compound is a mixture of two Group III–Group V semiconductor intermetallic compounds with the same positive valent element and said second body of material is a Group III–Group V compound having the same positive valent element.

8. The process of claim 6 in which said first body of semiconductor intermetallic compound material is a mixture of gallium arsenide and gallium phosphide and said second body of material is a mixture of gallium arsenide and gallium phosphide.

9. The method of synthesizing a ternary semiconductor intermetallic compound from two binary intermetallic compounds of elements of Group III–Group V of the Periodic Table of Elements, the positive valent element of both said intermetallic compounds being the same and relatively non-volatile, the negative valent elements of both of said intermetallic compounds being volatile, the method comprising the steps of heating quantities of each of said intermetallic compounds in a gaseous atmosphere consisting of a metallic halide wherein said metallic constituent is a metal other than one of the elements of said two binary compounds to a temperature to cause volatilization of said negative valent elements and reaction of the positive valent element thereof with said halide source, and cooling said volatilization products to form said ternary intermetallic compound.

10. The method of preparing a composite semiconductor body consisting of a first body of semiconductor intermetallic compound material composed of an element of Group III and an element of Group V of the Periodic Table of Elements and a first conductivity type on a second body of monocrystalline semiconductor material of a second conductivity type which method comprises placing a volatizable material of the said first conductivity inducing type adjacent a quantity of said first semiconductor intermetallic compound, heating said quantity of said compound and said volatizable material in a gaseous atmosphere of a metallic halide having a metallic constituent other than one of the elements of said first semiconductor body to cause volatilization of said first intermetallic compound and said material, transporting said volatilized elements and material to said second body of semiconductor material, and maintaining said second body at a temperature to cause epitaxial growth of said volatilized material thereon to form said composite body.

11. The method of preparing a composite body consisting of a first body of semiconductor intermetallic compound material of a first conductivity type composed of an element of Group III and an element of Group V of the Periodic Table of Elements, said Group III element being non-volatile, said Group V element being volatile, on a second body of semiconductor material from the group consisting of germanium and Group III–Group V compounds, the method comprising placing a metallic halide selected from the group consisting of zinc chloride, mercuric chloride, cadmium chloride, copper chloride, tin chloride, aluminum chloride, and magnesium chloride adjacent a first quantity of the compound of said first body, heating said first quantity and said metallic halide to cause volatilization of said constituents thereof, transporting said volatilized constituents to said second body, said second body being a monocrystalline substrate of a conductivity type opposite to that of said first body and maintaining said second body at a temperature to cause epitaxial growth of said volatilized material thereon to form said composite body.

12. The method of preparing a composite semiconductor body consisting of a first body of semiconductor compound material composed of elements of Group III–Group V of the Periodic Table of Elements, the negative valent constituent of which is volatile and the positive valent constituent of which reacts with an element of the halogen group of elements to form a volatizable material, on a second semiconductor body of one conductivity type selected from the group consisting of Group III–Group V compounds and germanium, the method comprising placing a quantity of the material of said first semiconductor compound in a first zone of an evacuated sealed enclosure, placing said second body in a second zone of said enclosure, placing a quantity of a metallic halide in a third zone of said enclosure in between said first and second zones, the metallic halide selected from the group of zinc chloride, mercuric chloride, cadmium chloride, tin chloride, aluminum chloride, magnesium chloride, and copper chloride and capable of impregnating the material of said first body of semiconductor compound to induce a different type conductivity therein, maintaining said first zone and said third zone at temperatures to cause volatilization of said quantity of the material of said semiconductor compound, and maintaining said second zone at another lower temperature than either of said other temperatures to cause recrystallization of said volatilization products to form the said composite body of said first body of said different type conductivity on said second body of one type conductivity.

13. The method of preparing a body of semiconductor compound material composed of elements of Groups III and V of the Periodic Table of Elements, the positive valent constituent of which reacts with an element of the halogen group of elements to form a volatilizable material, comprising heating quantities of constituents of said body in a first zone of an evacuated sealed enclosure, placing a quantity of a metallic halide in a third zone of said enclosure, the metallic element of said halide being selected from the group consisting of zinc, mercury, cadmium, tin, aluminum, magnesium, and copper, and being capable of impregnating said body of semiconductor compound material to induce a specific type conductivity therein, maintaining said first zone and said third zone at temperatures to cause volatilization of said quantities of said semiconductor compound constituents, and maintaining a second zone in said enclosure at another lower temperature than that of said first and third zones to cause recrystallization of said volatilization products forming the semiconductor compound material.

14. The method of preparing a semiconductor compound composed of elements of Group III and Group V of the Periodic Table of Elements comprising placing quantities of each of the elements thereof in a first zone of an evacuated hermetically sealed enclosure, placing in a third zone of said enclosure a quantity of a metallic halide, the metallic element of said halide selected from the group consisting of zinc, mercury, cadmium, tin, aluminum, magnesium, and copper, heating said first and third zones to temperatures to volatilize said elements of said semiconductor compound and said metallic halide, and maintaining a second zone within said enclosure at a lower temperature than said first and third zones to cause crystallization of said volatilization products to form said semiconductor compound, the metal of said halide impregnating the crystallized semiconductor compound and determining the conductivity type thereof.

References Cited by the Examiner

UNITED STATES PATENTS

| | | | |
|---|---|---|---|
| 2,692,839 | 10/1954 | Christensen et al. | 148—175 |
| 2,798,989 | 7/1957 | Welker | 317—237 |
| 2,871,100 | 1/1959 | Guire et al. | 23—204 |
| 2,929,859 | 3/1960 | Loferski | 136—89 |
| 2,937,114 | 5/1960 | Shockley | 148—187 |
| 2,953,488 | 9/1960 | Shockley | 148—33.5 |
| 3,021,196 | 2/1962 | Merkel | 23—204 |
| 3,094,388 | 6/1963 | Johnson et al. | 23—204 |
| 3,145,125 | 8/1964 | Lyons | 148—175 |
| 3,173,814 | 3/1965 | Law | 148—175 |

FOREIGN PATENTS

| | | |
|---|---|---|
| 1,193,194 | 10/1959 | France. |
| 1,029,941 | 5/1958 | Germany. |
| 916,498 | 1/1963 | Great Britain. |

DAVID L. RECK, *Primary Examiner.*